(12) United States Patent
Tseng

(10) Patent No.: US 10,958,284 B2
(45) Date of Patent: Mar. 23, 2021

(54) TIME-INTERLEAVED DIGITAL-TO-ANALOG CONVERTER WITH TIME-DOMAIN DYNAMIC ELEMENT MATCHING AND ASSOCIATED METHOD

(71) Applicant: MEDIATEK INC., Hsin-Chu (TW)

(72) Inventor: Wei-Hsin Tseng, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/894,860

(22) Filed: Jun. 7, 2020

(65) Prior Publication Data

US 2021/0021279 A1    Jan. 21, 2021

Related U.S. Application Data

(60) Provisional application No. 62/875,020, filed on Jul. 17, 2019.

(51) Int. Cl.
| | |
|---|---|
| H03M 1/66 | (2006.01) |
| H03M 1/74 | (2006.01) |
| H03M 1/06 | (2006.01) |
| H03M 3/00 | (2006.01) |

(52) U.S. Cl.
CPC ............ *H03M 1/74* (2013.01); *H03M 1/0665* (2013.01); *H03M 3/464* (2013.01); *H03M 3/502* (2013.01)

(58) Field of Classification Search
CPC ........ H03M 1/74; H03M 3/502; H03M 3/464; H03M 1/0665; H03M 1/66
USPC ....................................................... 341/144
See application file for complete search history.

(56) References Cited

U.S. PATENT DOCUMENTS

| | | | | |
|---|---|---|---|---|
| 6,356,224 B1* | 3/2002 | Wohlfarth | ................. | G06J 1/00 |
| | | | | 327/106 |
| 6,496,550 B1* | 12/2002 | Bruccoleri | ....... | G11B 20/10277 |
| | | | | 375/345 |
| 6,930,625 B1* | 8/2005 | Lin | ......................... | H03M 3/47 |
| | | | | 341/143 |

(Continued)

FOREIGN PATENT DOCUMENTS

WO    2019/108301 A1    6/2019

OTHER PUBLICATIONS

Ian Galton, Why Dynamic-Element-Matching DACs Work, IEEE Transactions on Circuits and Systems II: Express Briefs, vol. 57, No. 2, Feb. 2010, IEEE, USA, pp. 69-74, XP011303636, Feb. 2020.

*Primary Examiner* — Jean B Jeanglaude
(74) *Attorney, Agent, or Firm* — Winston Hsu

(57) ABSTRACT

A time-interleaved digital-to-analog converter (DAC) includes a digital processing circuit, a time-domain dynamic element matching (TDEM) circuit, a plurality of DACs, and a combining circuit. The digital processing circuit generates data sequences according to the digital signal. The data sequences include a first data sequence and a second data sequence. The TDEM circuit swaps a portion of the first data sequence with a portion of the second data sequence to generate a first adjusted data sequence and a second adjusted data sequence. The DACs include a first DAC and a second DAC. The first DAC has a first DAC cell that operates in response to the first adjusted data sequence. The second DAC has a second DAC cell that operates in response to the second adjusted data sequence. The combining circuit generates the analog signal by combining analog outputs of the DACs.

20 Claims, 10 Drawing Sheets

(56) References Cited

U.S. PATENT DOCUMENTS

| | | | | |
|---|---|---|---|---|
| 7,254,194 | B2* | 8/2007 | Lin | H03G 3/3078 |
| | | | | 375/317 |
| 7,372,386 | B1* | 5/2008 | Maloberti | H03M 1/0626 |
| | | | | 341/137 |
| 9,571,120 | B2* | 2/2017 | Kuttner | H03M 1/662 |
| 9,685,969 | B1* | 6/2017 | Garg | H03M 1/662 |
| 9,716,508 | B1* | 7/2017 | Zhang | H03M 1/0863 |
| 10,101,907 | B2* | 10/2018 | Dupont | H03M 1/12 |
| 10,601,434 | B1* | 3/2020 | Molina | G06F 1/04 |
| 2003/0142659 | A1* | 7/2003 | Lin | H03G 3/3089 |
| | | | | 370/351 |
| 2016/0094235 | A1* | 3/2016 | Kuttner | H03M 1/662 |
| | | | | 341/144 |
| 2018/0225040 | A1* | 8/2018 | Dupont | H03M 7/55 |

* cited by examiner

TIME-INTERLEAVED DIGITAL-TO-ANALOG CONVERTER WITH TIME-DOMAIN DYNAMIC ELEMENT MATCHING AND ASSOCIATED METHOD

CROSS REFERENCE TO RELATED APPLICATIONS

This application claims the benefit of U.S. provisional application No. 62/875,020, filed on Jul. 17, 2019 and incorporated herein by reference.

BACKGROUND

The present invention relates to digital-to-analog conversion, and more particularly, to a time-interleaved digital-to-analog converter with time-domain dynamic element matching and an associated method.

High speed and large bandwidth digital-to-analog converters (DACs) are in great demand for a variety of applications. Time-interleaved DACs enable high speed digital-to-analog conversion operation but suffer from distortion due to mismatches between different DAC channels. Thus, there is a need for innovative time-interleaved DAC architecture which can mitigate the distortion caused by gain mismatch, offset mismatch and/or timing mismatch between different DAC channels.

SUMMARY

One of the objectives of the claimed invention is to provide a time-interleaved digital-to-analog converter with time-domain dynamic element matching and an associated method.

According to a first aspect of the present invention, an exemplary time-interleaved digital-to-analog converter (DAC) for converting a digital signal into an analog signal is provided. The exemplary time-interleaved DAC includes a digital processing circuit, a time-domain dynamic element matching (TDEM) circuit, a plurality of DACs, and a combining circuit. The digital processing circuit is arranged to generate a plurality of data sequences according to the digital signal of the time-interleaved DAC, wherein the data sequences includes a first data sequence and a second data sequence. The TDEM circuit is arranged to swap a portion of the first data sequence with a portion of the second data sequence to generate a first adjusted data sequence and a second adjusted data sequence, wherein the first adjusted data sequence includes first bits of the first data sequence and first bits of the second data sequence, and the second adjusted data sequence includes second bits of the first data sequence and second bits of the second data sequence. The DACs include a first DAC and a second DAC, wherein the first DAC includes a first DAC cell that operates in response to the first adjusted data sequence, and the second DAC includes a second DAC cell that operates in response to the second adjusted data sequence. The combining circuit is arranged to generate the analog signal by combining analog outputs of the DACs.

According to a second aspect of the present invention, an exemplary time-interleaved digital-to-analog conversion method for converting a digital signal into an analog signal is provided. The exemplary time-interleaved digital-to-analog conversion method includes: generating a plurality of data sequences according to the digital signal, wherein the data sequences include a first data sequence and a second data sequence; performing a time-domain dynamic element matching (TDEM) operation to generate a first adjusted data sequence and a second adjusted data sequence by swapping a portion of the first data sequence with a portion of the second data sequence, wherein the first adjusted data sequence includes first bits of the first data sequence and first bits of the second data sequence, and the second adjusted data sequence includes second bits of the first data sequence and second bits of the second data sequence; and generating the analog signal by combining analog outputs of a plurality of digital-to-analog converters (DACs) each having at least one DAC cell, wherein the DACs include a first DAC and a second DAC, the first DAC includes a first DAC cell that operates in response to the first adjusted data sequence, and the second DAC includes a second DAC cell that operates in response to the second adjusted data sequence.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
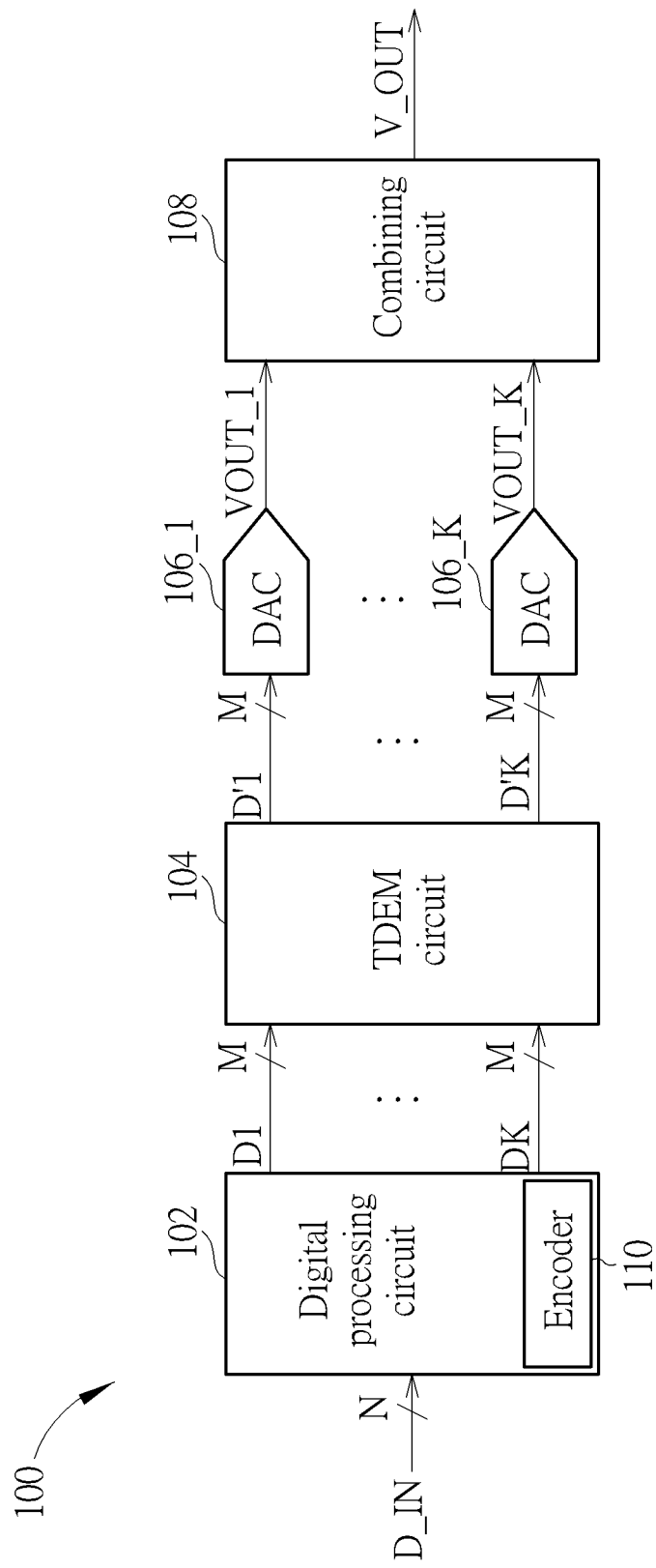
FIG. 1 is a block diagram illustrating a time-interleaved digital-to-analog converter (DAC) with time-domain dynamic element matching (TDEM) according to an embodiment of the present invention.

FIG. 1 is a block diagram illustrating a time-interleaved digital-to-analog converter (DAC) with time-domain dynamic element matching (TDEM) according to an embodiment of the present invention. The time-interleaved DAC 100 includes a digital processing circuit 102, a TDEM circuit 104, a plurality of DACs 106_1-106_K, and a combining circuit 108. Each of the DACs 106_1-106_K may be regarded as one DAC element (or called sub-DAC) of the time-interleaved DAC 100. The time-interleaved DAC 100 is used for converting a digital signal D_IN into an analog signal V_OUT. In this embodiment, the time-interleaved DAC 100 may be a K-channel N-bit time-interleaved DAC, and each of the DACs 106_1-106_K may have M DAC cells, where K, M and N are positive integers, K>1, N≥1, and $M=2^N-1$. The digital processing circuit 102 is arranged to generate a plurality of digital inputs D1-DK according to the digital signal D_IN, where each of the digital inputs D1-DK includes M data sequences. For example, a digital input Di includes data sequences D1_1-Di_M, where i=1~K. Considering a case where K=2, the digital input D1 includes data sequences D1_1-D1_M, and the digital input D2 (i.e., DK=D2) includes data sequences D2_1-D2_M.

The TDEM circuit 104 is arranged to employ a proposed TDEM scheme for adjusting the digital inputs D1-DK to generate adjusted digital inputs D'1-D'K, where each of the adjusted digital inputs D'1-D'K includes M adjusted data sequences. For example, an adjusted digital input D'i includes adjusted data sequences D'i_1-D'i_M, where i=1~K. Considering a case where K=2, the adjusted digital input D'1 includes adjusted data sequences D'1_1-D'1_M, and the adjusted digital input D'2 (i.e., D'K=D'2) includes adjusted data sequences D'2_1-D'2_M. In this embodiment, the TDEM circuit 104 may swap a portion of a data sequence (e.g., D1_j, where j=1~M) included in one digital input (e.g., D1) with a portion of a data sequence (e.g., DK_j, where j=1~M) included in another digital input (e.g., DK) to generate an adjusted data sequence (e.g., D'1_j, where j=1~M) included in one adjusted digital input (e.g., D'1) and an adjusted data sequence (e.g., D'K_j, where j=1~M) included in another adjusted digital input (e.g., D'K). Hence, one adjusted data sequence (e.g., D'1_j, where j=1~M) includes first bits of one data sequence (e.g., D1_j, where j=1~M) and first bits of another data sequence (e.g., DK_j, where j=1~M), and another adjusted data sequence (e.g., D'k_j, where j=1~M) includes second bits of one data sequence (e.g., D1_j, where j=1~M) and second bits of another data sequence (e.g., DK_j, where j=1~M).

The DACs 106_1-106_K are arranged to receive the adjusted digital inputs D'1-D'K and convert the adjusted digital inputs D'1-D'K into analog outputs VOUT_1-VOUT_K, respectively. The combining circuit 108 is arranged to generate the analog signal V_OUT by combining analog outputs VOUT_1-VOUT_K of the DACs 106_1-106_K.

Figure 2:
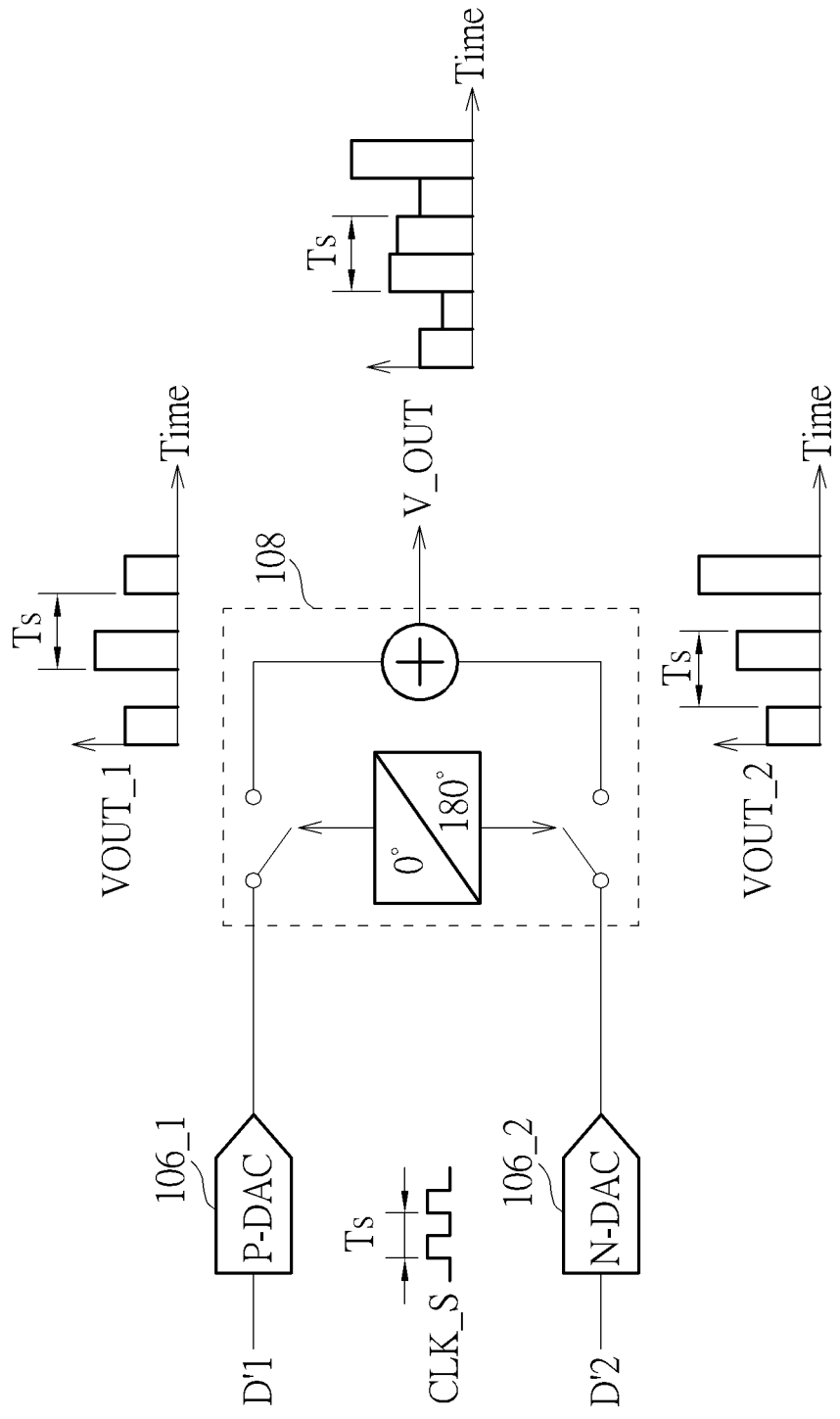
FIG. 2 is a diagram illustrating an operation of a combining circuit shown in FIG. 1 according to an embodiment of the present invention.

For example, the combining circuit 108 may generate the analog signal V_OUT by applying interleaving to the analog outputs VOUT_1-VOUT_K. FIG. 2 is a diagram illustrating an operation of a combining circuit according to an embodiment of the present invention. Suppose that the time-interleaved DAC 100 is a two-channel time-interleaved DAC, where K=2. Hence, the time-interleaved DAC 100 includes two DACs 106_1 and 106_2 (also denoted as "P-DAC" and "N-DAC") that are used for applying digital-to-analog conversion to adjusted data inputs D'1 and D'2, respectively. One key difference between the proposed time-interleaved DAC 100 and a conventional time-interleaved DAC is that digital inputs of DACs 106_1 and 106_2 are generated via the proposed TDEM scheme. The converted voltages generated at the DAC 106_1 are sampled and output at rising edges of a clock CLK_S (which has a period Ts), and the converted voltages generated at the DAC 106_2 are sampled and output at falling edges of the clock CLK_S. Hence, the analog output VOUT_1 of the DAC 106_1 and the analog output VOUT_2 of the DAC 106_2 are interleaved at the combining circuit 108 to generate the analog signal V_OUT.

Figure 3:
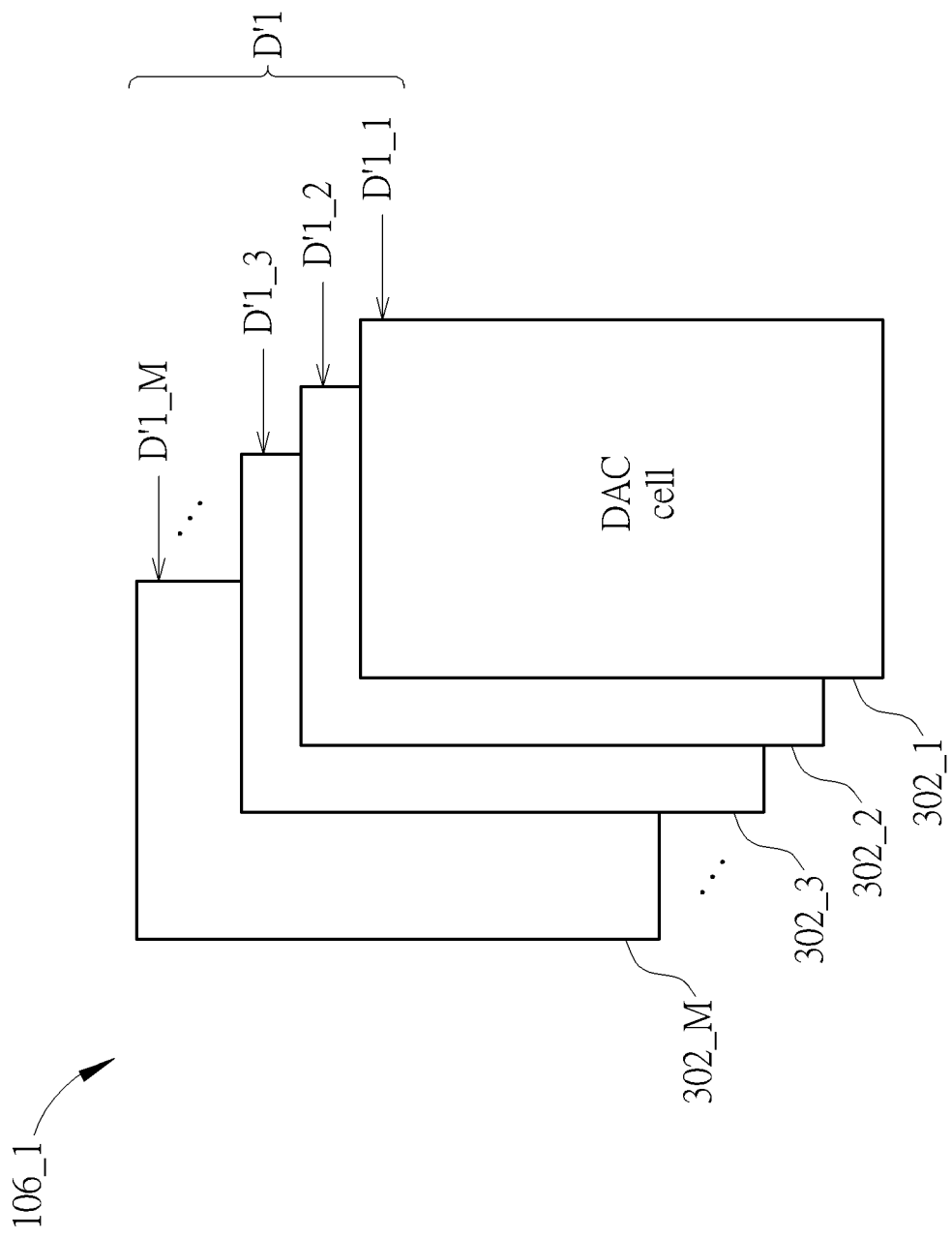
FIG. 3 is a block diagram illustrating a DAC used in a time-interleaved DAC according to an embodiment of the present invention.

In this embodiment, each of the DACs 106_1-106_K may have M DAC cells, and the digital processing circuit 102 may have an encoder 110 used to encode each N-bit codeword of the digital signal D_IN into one M-bit thermometer code, where M bits of one thermometer code are distributed to M data sequences included in one of the digital inputs D1-DK, respectively. In other words, the digital inputs D1-DK include different bits of the same thermometer code. Bits of one thermometer code are used to control on/off states of DAC cells. FIG. 3 is a block diagram illustrating a DAC used in a time-interleaved DAC according to an embodiment of the present invention. Each of the DACs 106_1-106_K may have the same structure. For clarity and simplicity, only the DAC 106_1 is illustrated in FIG. 3. The DAC 106_1 includes a plurality of DAC cells 302_1-302_M that operate in response to adjusted data sequences D'1_1, D'1_2, D1_3, . . . , D'1_M included in the adjusted digital input D'1 generated from the TDEM circuit 104. Since the adjusted digital inputs D'1-D'K are derived from applying a TDEM technique to the digital inputs D1-DK, the distortion caused by gain mismatch, offset mismatch and/or timing mismatch between DACs 106_1-106_K used by different DAC channels of the time-interleaved DAC 100 can be mitigated. Further details of the proposed TDEM scheme are described as below.

Figure 4:
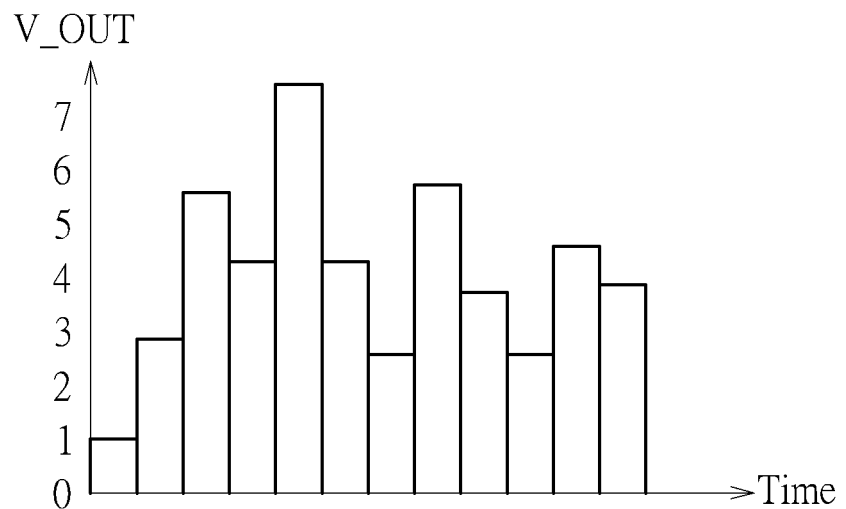
FIG. 4 is a diagram illustrating a time-interleaved DAC operation without TDEM according to an embodiment of the present invention.

FIG. 4 is a diagram illustrating a time-interleaved DAC operation without TDEM according to an embodiment of the present invention. Suppose that the time-interleaved DAC 100 is a 2-channel 3-bit time-interleaved DAC as shown in FIG. 2. Considering a case where the TDEM circuit 104 directly bypasses the digital inputs D1 and D2 to the DACs 106_1 and 106_2, respectively, DAC cells of the DAC 106_1 ("P-DAC") may operate in response to bits of each even-numbered thermometer code C0, C2, C4, C6, C8, C10 generated from the encoder 110, and DAC cells of the DAC 106_2 ("N-DAC") may operate in response to bits of each odd-numbered thermometer code C1, C3, C5, C7, C9, C11 generated from the encoder 110. In this example, the thermometer code C0 may be "0000001" from MSB (most significant bit) to LSB (least significant bit), the thermometer code C1 may be "0000111" from MSB to LSB, the thermometer code C2 may be "0011111" from MSB to LSB, the thermometer code C3 may be "0001111" from MSB to LSB, the thermometer code C4 may be "1111111" from MSB to LSB, the thermometer code C5 may be "0001111" from MSB to LSB, the thermometer code C6 may be "0000011" from MSB to LSB, the thermometer code C7 may be "0011111" from MSB to LSB, the thermometer code C8 may be "0000111" from MSB to LSB, the thermometer code C9 may be "0000011" from MSB to LSB, the thermometer code C10 may be "0001111" from MSB to LSB, and the thermometer code C11 may be "0000111" from MSB to LSB.

In this example, the TDEM function is not enabled. When bits of one thermometer code are received by DAC cells (denoted by "cell-1", "cell-2", "cell-3", "cell-4", "cell-5", "cell-6", and "cell-7") of the DAC 106_1 ("P-DAC"), any DAC cell that receives "1" is turned on, and any DAC cell that receives "0" is turned off. When bits of one thermometer code are received by DAC cells (denoted by "cell-1", "cell-2", "cell-3", "cell-4", "cell-5", "cell-6", and "cell-7") of the DAC 106_2 ("N-DAC"), any DAC cell that receives "1" is turned on, and any DAC cell that receives "0" is turned off. For example, when bits of the thermometer code C0 are received by DAC cells of the DAC 106_1 ("P-DAC"), the DAC cell "cell-1" is turned on, while the DAC cells "cell-2"-"cell-7" are turned off; and when bits of the thermometer code C1 are received by DAC cells (denoted by "cell-1", "cell-2", "cell-3", "cell-4", "cell-5", "cell-6", and "cell-7") of the DAC 106_2 ("N-DAC"), the DAC cells "cell-1"-"cell-3" are turned on, while the DAC cells "cell-4"-"cell-7" are turned off.

The data sequences D1_1-D1_M (M=7) fed into DAC cells "cell-1"-"cell-7" of the DAC 106_1 ("P-DAC") are set by the thermometer code C0, C2, C4, C6, C8, and C10. In addition, the data sequences D2_1-D2_M (M=7) fed into DAC cells "cell-1"-"cell-7" of the DAC 106_2 ("N-DAC") are set by the thermometer code C1, C3, C5, C7, C9, and C11. For example, the data sequence D1_1 fed into the DAC cell "cell-1" of the DAC 106_1 ("P-DAC") is set by "111111", and the data sequence D2_1 fed into the DAC cell "cell-1" of the DAC 106_2 ("N-DAC") is set by "111111". For another example, the data sequence D1_2 fed into the DAC cell "cell-2" of the DAC 106_1 ("P-DAC") is set by "011111", and the data sequence D2_2 fed into the DAC cell "cell-2" of the DAC 106_2 ("N-DAC") is set by "111111".

Figure 5:
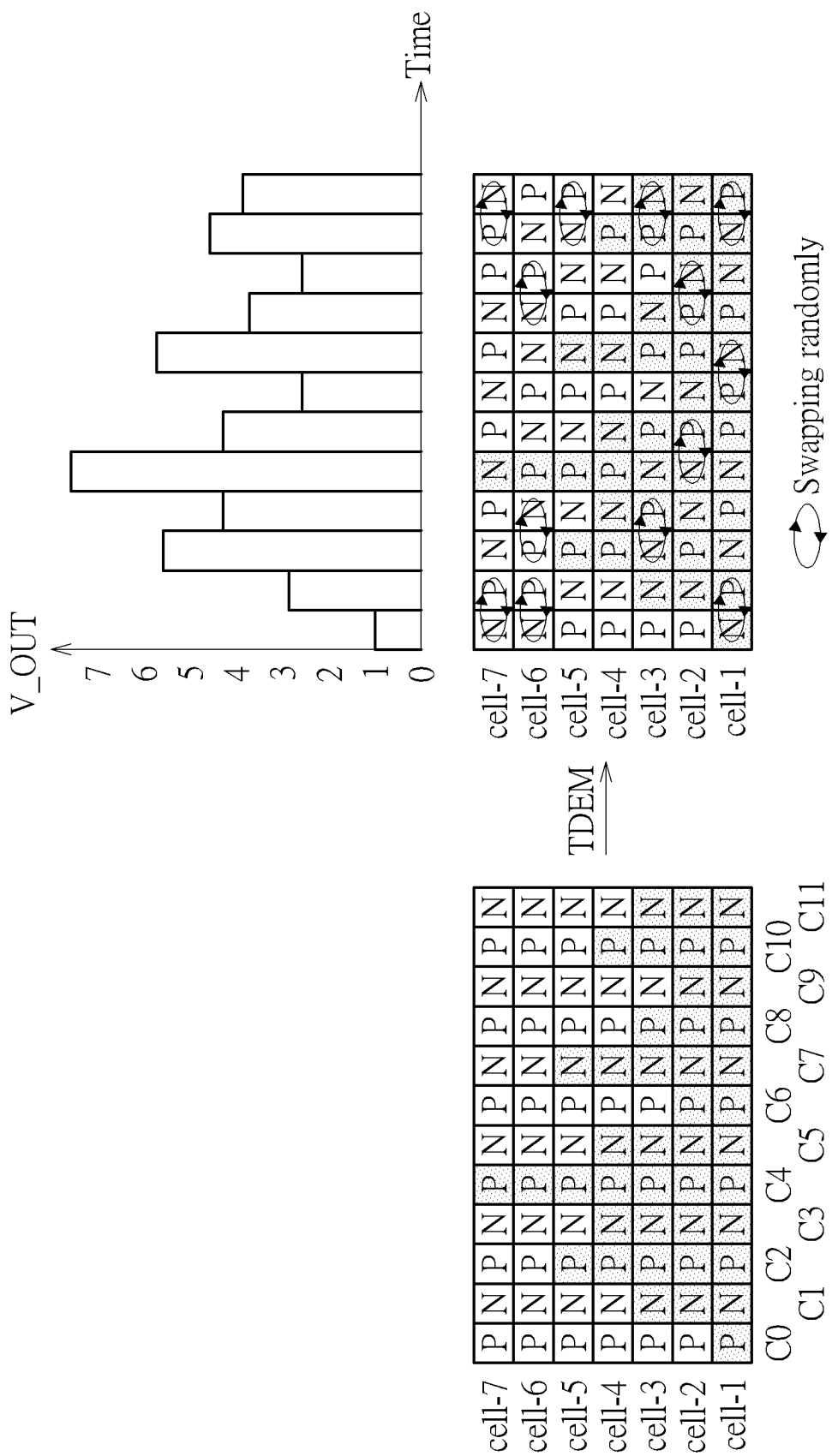
FIG. 5 is a diagram illustrating a time-interleaved DAC operation with TDEM according to an embodiment of the present invention.

To dither gain mismatch, offset mismatch and/or timing mismatch between DAC elements used by different DAC channels of a time-interleaved DAC, the present invention proposes a TDEM scheme. FIG. 5 is a diagram illustrating a time-interleaved DAC operation with TDEM according to an embodiment of the present invention. Suppose that the time-interleaved DAC 100 is a 2-channel time-interleaved DAC as shown in FIG. 2. In this example, the TDEM circuit 104 is enabled to apply a TDEM technique to the digital inputs D1 and D2 for generating the adjusted digital inputs D'1 and D'2 to the DACs 106_1 and 106_2, respectively, where DAC cells "cell-1"-"cell-7" of the DAC 106_1 ("P-DAC") operate in response to adjusted data sequences D'1_1-D'1_M (M=7), respectively, and DAC cells "cell-1"-"cell-7" of the DAC 106_2 ("N-DAC") operate in response to adjusted data sequences D'2_1-D'2_M (M=7), respectively.

As shown in FIG. 5, a voltage level representative of the thermometer code C0 is output by turning on DAC cell "cell-1" of the DAC 106_2 ("N-DAC") and turning off DAC cells "cell-2"-"cell-5" of the DAC 106_1 ("P-DAC") and DAC cells "cell-6"-"cell-7" of the DAC 106_2 ("N-DAC"); a voltage level representative of the thermometer code C1 is output by turning on DAC cell "cell-1" of the DAC 106_1 ("P-DAC") and DAC cells "cell-2"-"cell-3" of the DAC 106_2 ("N-DAC"), and turning off DAC cells "cell-4"-"cell-5" of the DAC 106_2 ("N-DAC") and DAC cells "cell-6"-"cell-7" of the DAC 106_1 ("P-DAC"); and a voltage level representative of the thermometer code C2 is output by turning on DAC cells "cell-1" and "cell-3" of the DAC 106_2 ("N-DAC") and DAC cells "cell-2", cell-4", and "cell-5" of the DAC 106_1 ("P-DAC"), and turning off DAC cell "cell-6" of the DAC 106_1 ("P-DAC") and DAC cell "cell-7" of the DAC 106_2 ("N-DAC"); and so on. In accordance with the proposed TDEM scheme, a first bit and a second bit to be successively processed by a DAC cell of a first DAC and a DAC cell of a second DAC are swapped in the time-domain, such that the second bit and the first bit are successively processed by the DAC cell of the first DAC and the DAC cell of the second DAC.

In some embodiments of the present invention, the proposed TDEM scheme may collaborate with a typical DEM scheme to further reduce the element matching errors of a single channel DAC and improve the performance of a time-interleaved DAC.

Figure 6:
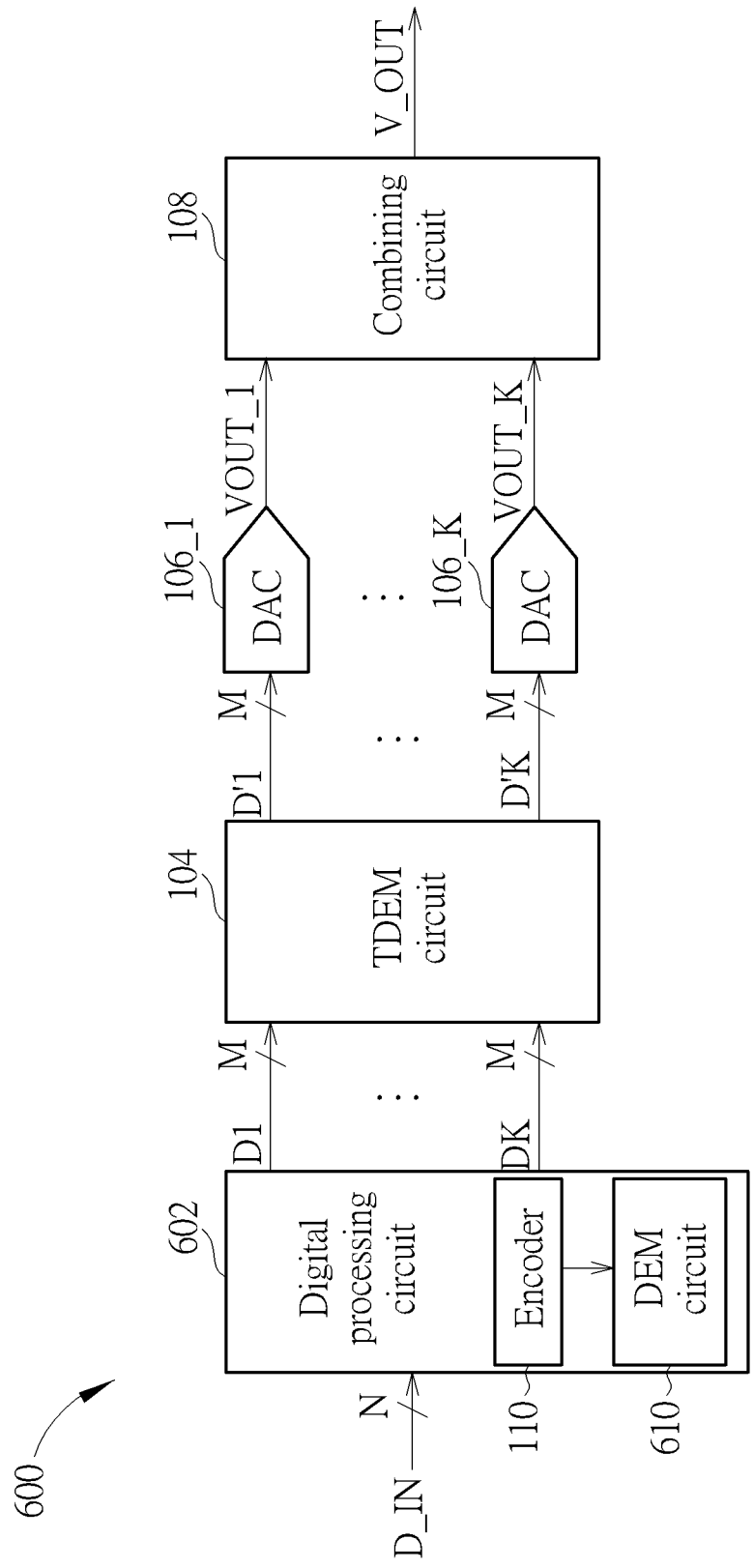
FIG. 6 is a block diagram illustrating another time-interleaved DAC with TDEM according to an embodiment of the present invention.

FIG. 6 is a block diagram illustrating another time-interleaved DAC with TDEM according to an embodiment of the present invention. The major difference between the time-interleaved DACs 100 and 600 is that the digital processing circuit 602 includes a DEM circuit 610 that is arranged to employ a DEM scheme different from the proposed TDEM scheme. The DEM circuit 610 is arranged to set the digital inputs D1-DK by applying a DEM algorithm to each thermometer code generated from the encoder 110. By way of example, but not limitation, the DEM algorithm employed by the DEM circuit 610 may be a data weighted averaging (DWA) algorithm, a random scrambling algorithm, or other available DEM algorithm. The DEM circuit 610 sets M data sequences of one digital input Di according to the DEM algorithm that is performed based on M DAC cells of a corresponding DAC 1061, where i=1~K.

Figure 7:
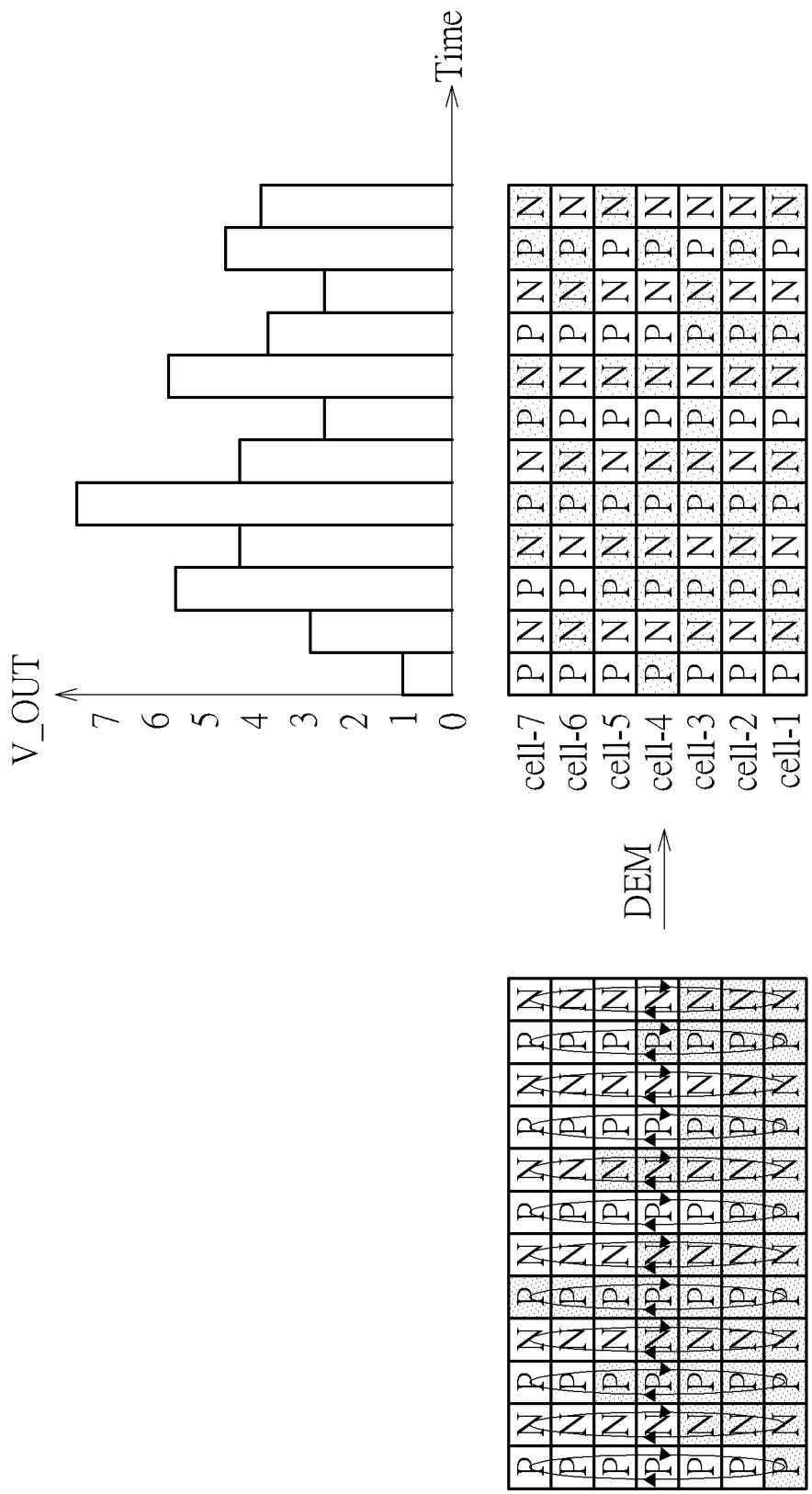
FIG. 7 is a diagram illustrating another time-interleaved DAC operation without TDEM according to an embodiment of the present invention.

FIG. 7 is a diagram illustrating another time-interleaved DAC operation without TDEM according to an embodiment of the present invention. Suppose that the time-interleaved DAC 100 is a 2-channel time-interleaved DAC as shown in FIG. 2. Considering a case where the TDEM circuit 104 directly bypasses the digital inputs D1 and D2 to the DACs 106_1 and 106_2, respectively, DAC cells of the DAC 106_1 operates in response to the digital input D1, and DAC cells of the DAC 106_2 operates in response to the digital input D2. The DEM circuit 610 applies a DEM algorithm to each of the thermometer codes C0-C11. Hence, DAC cells of the DAC 106_1 operates in response to DEM results of even-numbered thermometer codes C0, C2, C4, C6, C8, C10, and DAC cells of the DAC 106_2 operates in response to DEM results of odd-numbered thermometer codes C1, C3, C5, C7, C9, C11.

In accordance with the employed DEM algorithm, a DEM result of the thermometer code C0 may be "0001000" from MSB to LSB, a DEM result of the thermometer code C1 may be "0100101" from MSB to LSB, a DEM result of the thermometer code C2 may be "0011111" from MSB to LSB, a DEM result of the thermometer code C3 may be "1011010" from MSB to LSB, a DEM result of the thermometer code C4 may be "1111111" from MSB to LSB, a DEM result of the thermometer code C5 may be "0101101" from MSB to LSB, a DEM result of the thermometer code C6 may be "1000100" from MSB to LSB, a DEM result of the thermometer code C7 may be "1011011" from MSB to LSB, a DEM result of the thermometer code C8 may be "0000111" from MSB to LSB, a DEM result of the thermometer code C9 may be "0100100" from MSB to LSB, a DEM result of the thermometer code C10 may be "1101010" from MSB to LSB, and a DEM result of the thermometer code C11 may be "1010001" from MSB to LSB.

In this example, the TDEM function is not enabled. When the DEM result of one thermometer code is received by DAC cells (denoted by "cell-1", "cell-2", "cell-3", "cell-4", "cell-5", "cell-6", and "cell-7") of the DAC 106_1 ("P-DAC"), any DAC cell that receives "1" is turned on, and any DAC cell that receives "0" is turned off. When the DEM result of one thermometer code is received by DAC cells (denoted by "cell-1", "cell-2", "cell-3", "cell-4", "cell-5", "cell-6", and "cell-7") of the DAC 106_2 ("N-DAC"), any DAC cell that receives "1" is turned on, and any DAC cell that receives "0" is turned off. For example, when the DEM result of the thermometer code C0 is received by DAC cells of the DAC 106_1 ("P-DAC"), the DAC cell "cell-4" is turned on, while the DAC cells "cell-1"-"cell-3" and "cell-5"-"cell7" are turned off; and when the DEM result of the thermometer code C1 is received by DAC cells of the DAC 106_2 ("N-DAC"), the DAC cells "cell-1", "cell-3", and "cell-6" are turned on, while the DAC cells "cell-2", "cell-4", "cell-5", and "cell-7" are turned off.

The data sequences D1_1-D1_M (M=7) fed into DAC cells "cell-1"-"cell-7" of the DAC 106_1 ("P-DAC") are set by DEM results of thermometer codes C0, C2, C4, C6, C8, and C10. In addition, the data sequences D2_1-D2_M (M=7) fed into DAC cells "cell-1"-"cell-7" of the DAC 106_2 ("N-DAC") are set by DEM results of thermometer codes C1, C3, C5, C7, C9, and C11. For example, the data sequence D1_1 fed into the DAC cell "cell-1" of the DAC 106_1 ("P-DAC") is "011010", and the data sequence D2_1 fed into the DAC cell "cell-1" of the DAC 106_2 ("N-DAC") is "101101". For another example, the data sequence D1_2 fed into the DAC cell "cell-2" of the DAC 106_1 ("P-DAC") is "011011", and the data sequence D2_2 fed into the DAC cell "cell-2" of the DAC 106_2 ("N-DAC") is "010100".

Figure 8:
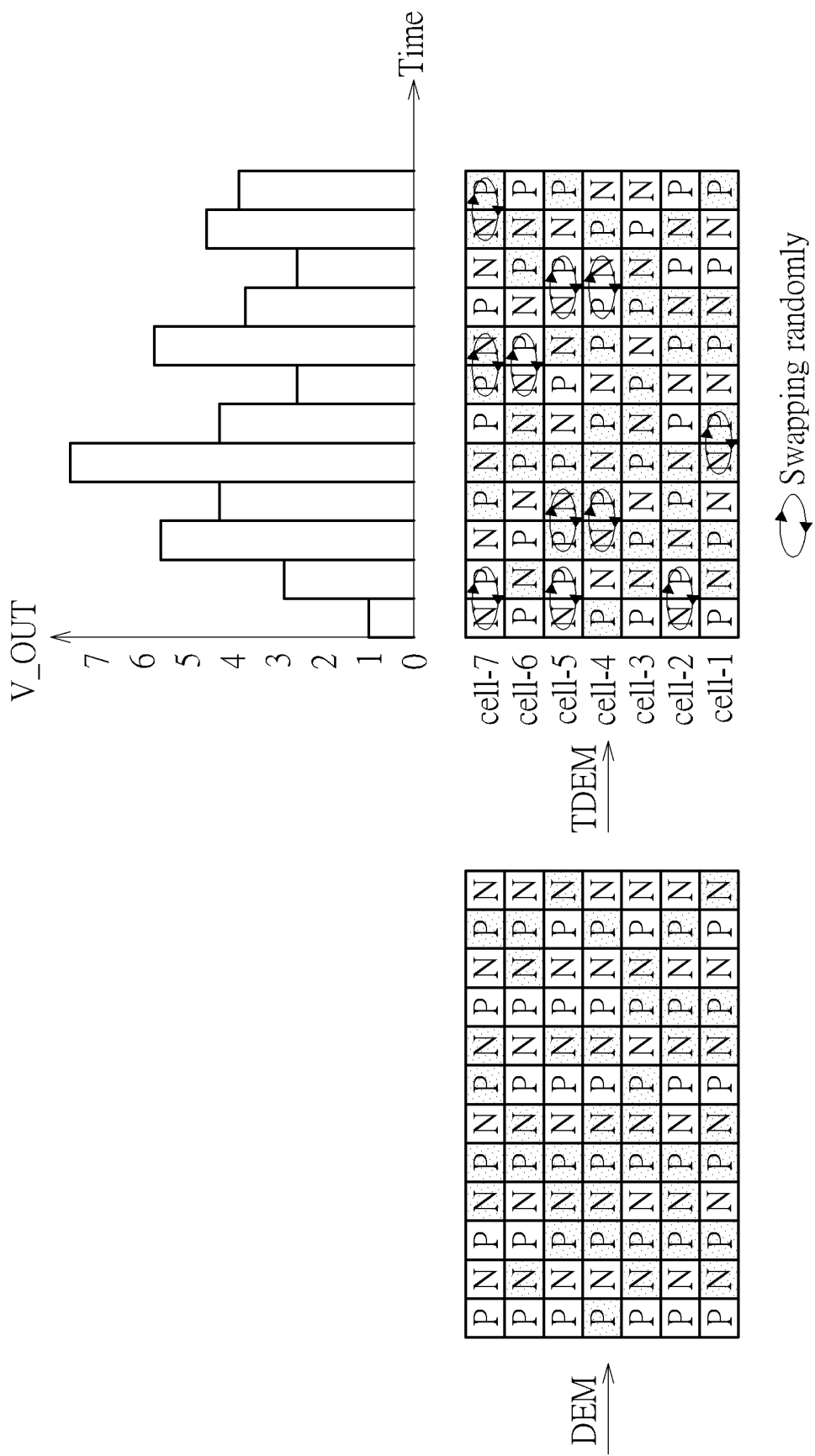
FIG. 8 is a diagram illustrating another time-interleaved DAC operation with TDEM according to an embodiment of the present invention.

To dither gain mismatch, offset mismatch and/or timing mismatch between DAC elements used by different DAC channels of a time-interleaved DAC, the present invention proposes a TDEM scheme. FIG. 8 is a diagram illustrating another time-interleaved DAC operation with TDEM according to an embodiment of the present invention. Suppose that the time-interleaved DAC 100 is a 2-channel time-interleaved DAC as shown in FIG. 2. In this example, the TDEM circuit 104 is enabled to apply a TDEM technique to the digital inputs D1 and D2 for generating the adjusted digital inputs D'1 and D'2 to the DACs 106_1 and 106_2, respectively, where the digital inputs D1 and D2 are set by the DEM circuit 610, DAC cells "cell-1"-"cell-7" of the DAC 106_1 ("P-DAC") operate in response to adjusted data sequences D'1_1-D'1_M (M=7), respectively, and DAC cells "cell-1"-"cell-7" of the DAC 106_2 ("N-DAC") operate in response to adjusted data sequences D'2_1-D'2_M (M=7), respectively.

As shown in FIG. 8, a voltage level representative of the thermometer code C0 is output by turning on DAC cell "cell-4" of the DAC 106_1 ("P-DAC") and turning off DAC cells "cell-1", cell-3", and "cell-6" of DAC 106_1 ("P-DAC") and DAC cells "cell-2", "cell-5", and "cell-7" of DAC 106_2 ("N-DAC"); a voltage level representative of the thermometer code C1 is output by turning on DAC cells "cell-1", "cell-3", and "cell-6" of the DAC 106_2 ("N-DAC"), and turning off DAC cells "cell-2", "cell-5", and "cell-7" of the DAC 106_1 ("P-DAC") and DAC cell "cell-4" of the DAC 106_2 ("N-DAC"); and a voltage level representative of the thermometer code C2 is output by turning on DAC cells "cell-1", "cell-3", and "cell-5" of the DAC 106_1 ("P-DAC") and DAC cells "cell-2" and "cell-4" of the DAC 106_2 ("N-DAC"), and turning off DAC cell "cell-6" of the DAC 106_1 ("P-DAC") and DAC cell "cell-7" of the DAC 106_2 ("N-DAC"); and so on. In accordance with the proposed TDEM scheme, a first bit and a second bit to be successively processed by a DAC cell of a first DAC and a DAC cell of a second DAC are swapped in the time-domain, such that the second bit and the first bit are successively processed by the DAC cell of the first DAC and the DAC cell of the second DAC.

With regard to the examples shown in FIGS. 5 and 8, the TDEM circuit 104 swaps a portion of a first data sequence with a portion of a second data sequence to generate a first adjusted data sequence (which is fed into one DAC cell of a first DAC located at a first channel of a time-interleaved DAC) and a second adjusted data sequence (which is fed into one DAC cell of a second DAC located at a second channel of the time-interleaved DAC), such that the first adjusted data sequence includes first bits of the first data sequence and first bits of the second data sequence, and the second adjusted data sequence includes second bits of the first data sequence and second bits of the second data sequence. In some embodiments of the present invention, the first bits of the second data sequence and the second bits of the first data sequence may be selected randomly to thereby avoid data-dependent noise resulting from TDEM.

Furthermore, with proper bit swapping as illustrated in FIGS. 5 and 8, the adjusted data sequence processed by one DAC cell includes bits from different data sequences generated from the digital processing circuit 102/602. Hence, a voltage level representative of one thermometer code may be determined by using DAC cells belonging to different DACs. In this way, the distortion caused by gain mismatch, offset mismatch and/or timing mismatch between DAC elements used by different DAC channels can be mitigated by the proposed TDEM scheme.

Inherent characteristics of a DAC cell may include a settling time that is required for generating a steady analog output in response to a digital input. If two successive bits of the DAC cell have different values, the DAC cell may need two settling time periods for generating different steady voltages representative of the two successive bits. If two successive bits of the DAC cell have the same value, the DAC cell may only need one settling time period for continuously generating the same steady voltage representative of the two successive bits. To ensure a high-speed DAC operation, the TDEM scheme may further check bits included in the data sequences to select the proper timing of bit swapping. Specifically, the timing of bit swapping of different data sequences may be controlled on the basis of a comparison result of bits included in the data sequences.

Figure 9:
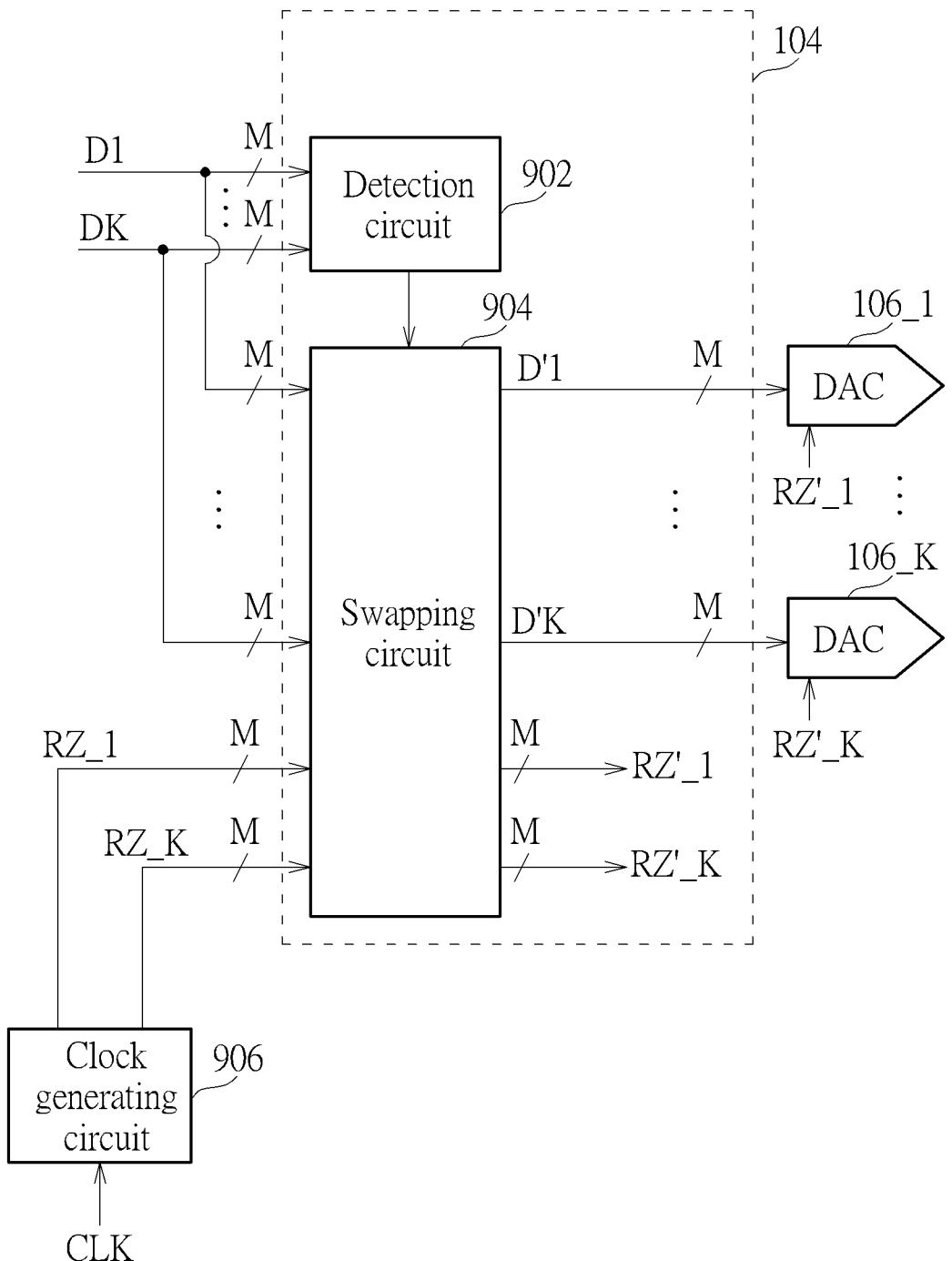
FIG. 9 is a block diagram illustrating an exemplary design of the TDEM circuit shown in FIGS. 1 and 6 according to an embodiment of the present invention.

FIG. 9 is a block diagram illustrating an exemplary design of the TDEM circuit 104 shown in FIGS. 1 and 6 according to an embodiment of the present invention. In this embodiment, the TDEM circuit 104 includes a detection circuit 902 and a swapping circuit 904. The detection circuit 902 is arranged to check a first data sequence of one digital input and a second data sequence of another digital input to generate a notification signal. The swapping circuit 904 is arranged to swap a portion of the first data sequence with a portion of the second data sequence according to the notification signal. For example, the detection circuit 902 detects if two bits to be successively processed have the same binary value, where the two bits to be successively processed include one bit belonging to the first data sequence (e.g., one bit of a first thermometer code) and one bit belonging to the second data sequence (e.g., one bit of a second thermometer code immediately following the first thermometer code), and generates the notification signal for informing the swapping circuit 904 of detection of two bits having the same binary value. In response to the notification signal, the swapping circuit 904 randomly determines whether to swap the portion of the first data sequence with the portion of the second data sequence. Since the swapping circuit 904 performs random sequence swapping, the data-dependent noise resulting from TDEM can be avoided.

Suppose that the time-interleaved DAC 100/600 is a 2-channel time-interleaved DAC as shown in FIG. 2. The detection circuit 902 may check data sequence D1_1 of digital input D1 and data sequence D2_1 of digital input D2 to generate a notification signal CS_1, check data sequence D1_2 of digital input D1 and data sequence D2_2 of digital input DK to generate a notification signal CS_2, and so on. The swapping circuit 904 may apply bit swapping to the data sequences D1_1 and D2_1 to generate adjusted data sequences D'1_1 and D'2_1 after notified by the notification signal CS_1, apply bit swapping to the data sequences D1_2 and D2_2 to generate adjusted data sequences D'1_2 and D'2_2 after notified by the notification signal CS_2, and so on.

In some embodiments of the present invention, the DACs 106_1-106_K may be triggered by clock inputs, respectively. For example, the time-interleaved DAC 100/600 may further include a clock generating circuit 906 shown in FIG. 9. The clock generating circuit 906 is arranged to generate a plurality of clock inputs RZ_1-RZ_K according to an external clock CLK provided by a clock source (not shown). The swapping circuit 904 may be further arranged to adjust the clock inputs RZ_1-RZ_K to generate a plurality of adjusted clock inputs RZ'_1-RZ'_K that are provided to the DACs 106_1-106_K, respectively. Each of the clock inputs RZ_1-RZ_K includes a plurality of reference clocks for a plurality of DAC cells, respectively. Each of the adjusted clock inputs RZ'_1-RZ'_K includes a plurality of clocks used to control DAC cells of a corresponding DAC.

The swapping circuit 904 may generate a first clock of one adjusted clock input and a second clock of another adjusted clock input by swapping a portion of a first reference clock of one clock input with a portion of a second reference clock of another clock input according to a notification signal. As mentioned above, the swapping circuit 904 randomly determines whether to swap the portion of the first data sequence with the portion of the second data sequence after notified by the notification signal. Similarly, in response to the notification signal, the swapping circuit 904 randomly determines whether to swap the portion of the first reference clock with the portion of the second reference clock. For example, when the swapping circuit 904 decides to swap the portion of the first data sequence with the portion of the second data sequence, the swapping circuit 904 further swaps the portion of the first reference clock with the portion of the second reference clock to ensure that the time-interleaved DAC with TDEM can operate correctly.

Suppose that the time-interleaved DAC 100 is a 2-channel 3-bit time-interleaved DAC as shown in FIG. 2. The clock input RZ_1 includes reference clocks RZ_11-RZ_1M (M=7) that are originally generated for M DAC cells of the DAC 106_1. The clock input RZ_2 includes reference clocks RZ_21-RZ_2M (M=7) that are originally generated for M DAC cells of the DAC 106_2. When the TDEM scheme is enabled for adjusting the data inputs D1 and D2 to generate the adjusted data inputs D'1 and D'2 for the DACs 106_1 and 106_2, respectively, the swapping circuit 904 further adjusts the clock inputs RZ_1 and RZ_2 to generate adjusted clock inputs RZ'_1 and RZ'_2 for the DACs 106_1 and 106_2, respectively, where M DAC cells of the DAC 106_1 are clocked by clocks RZ'_11-RZ'_1M included in the adjusted clock input RZ'_1, and M DAC cells of the DAC 106_2 are clocked by clocks RZ'_21-RZ'_2M included in the adjusted clock input RZ'_2. Specifically, the swapping circuit 904 may apply clock swapping to the reference clocks RZ_11 and RZ_21 to generate input clocks RZ'_11 and RZ'_21, apply clock swapping to the reference clocks RZ_12 and RZ_22 to generate clocks RZ'_12 and RZ'_22, and so on.

Figure 10:
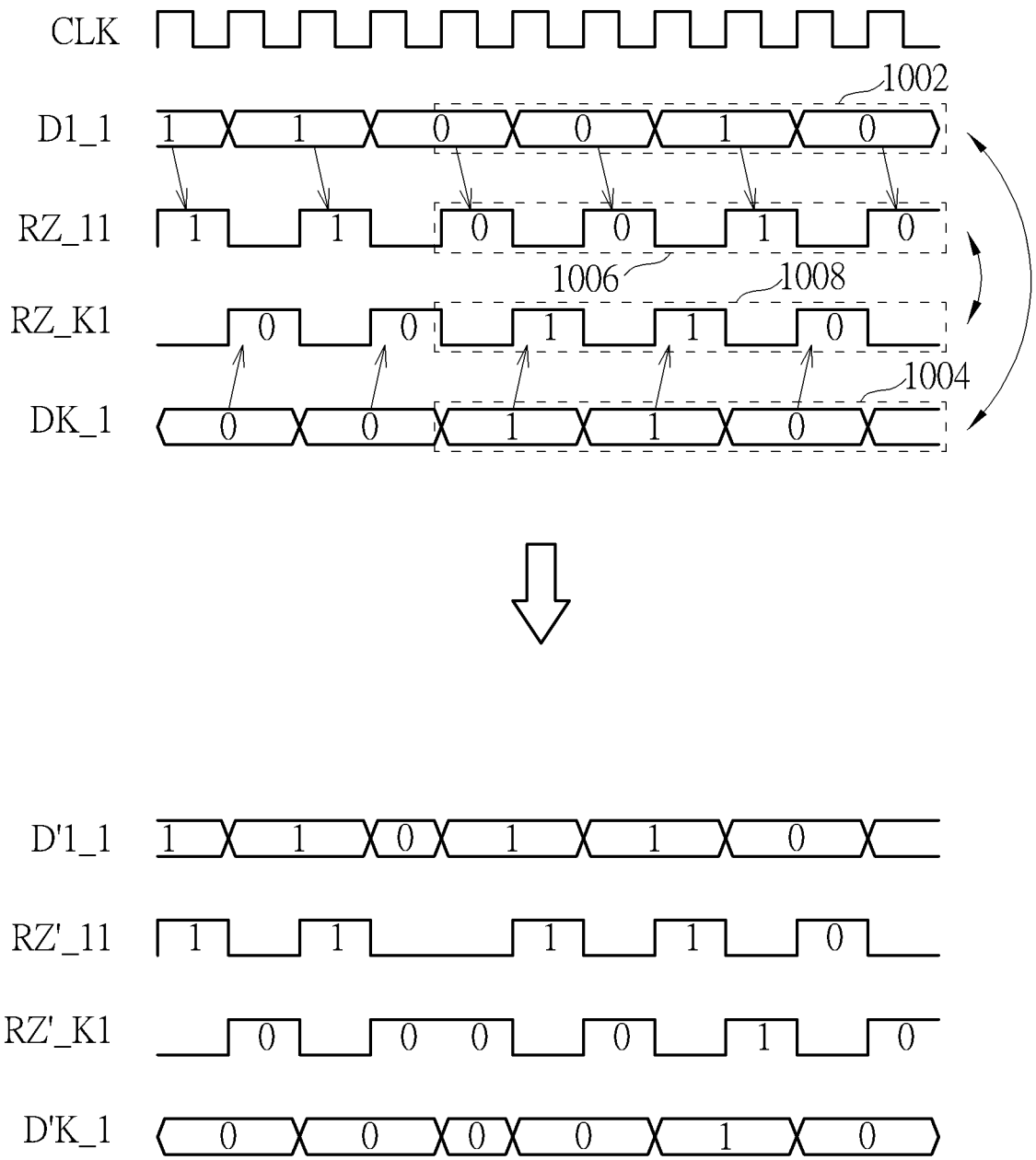
FIG. 10 is a diagram illustrating a random sequence swapping operation according to an embodiment of the present invention.

FIG. 10 is a diagram illustrating a random sequence swapping operation according to an embodiment of the present invention. Suppose that the time-interleaved DAC 100/600 is a 2-channel 3-bit time-interleaved DAC as shown in FIG. 2. The digital processing circuit 102/602 provides data sequences D1_1 and DK_1 (K=2), where the data sequence D1_1 is a part of the digital input D1 that is originally generated for the DAC 106_1, and the data sequence DK_1 is a part of the digital input DK (K=2) that is originally generated for the DAC 106_2. The clock generating circuit 906 provides reference clocks RZ_11 and RZ_K1 (K=2). The TDEM circuit 104 generates adjusted data sequences D1_1 and D'K_1 (K=2) according to the data sequences D1_1 and DK_1, and generates clocks RZ'_11 and RZ'_K1 (K=2) according to the reference clocks RZ_11 and RZ_K1. Specifically, one DAC cell (e.g., "cell-1") of the DAC 106_1 is clocked by the clock RZ'_11 and operates in response to the adjusted data sequence D'1_1. One DAC cell (e.g., "cell-1") of the DAC 106_2 is clocked by the clock RZ'_K1 (K=2) and operates in response to the adjusted data sequence D'K_1 (K=2).

With regard to generation of adjusted data sequences D'1_1 and D'K_1 (K=2) and clocks RZ'_11 and RZ'_K1 (K=2), the detection circuit 902 monitors the data sequences D1_1 and DK_1 (K=2) for checking bits that are to be processed by the DAC cell (e.g., "cell-1") of the DAC 106_1 and the DAC cell (e.g., "cell-1") of the DAC 106_2, successively and alternatingly. As shown in a top part of FIG. 10, the data sequence D1_1 is originally sampled by rising edges of the reference clock RZ_11, and the data sequence DK_1 (K=2) is originally sampled by rising edges of the reference clock RZ_K1 (K=2). Hence, bits to be successively processed are "10100101100". The detection circuit 902 finds that two bits to be successively processed have the same value "0", and generates a notification signal to notify the swapping circuit 904. After notified by the detection circuit 902, the swapping circuit 904 randomly determines whether to enable bit swapping for changing bit patterns of data sequences fed into the DAC cell (e.g., "cell-1") of the DAC 106_1 and the DAC cell (e.g., "cell-1") of the DAC 106_2, and randomly determines whether to enable clock swapping for changing clock pulse sequences provided to the DAC cell (e.g., "cell-1") of the DAC 106_1 and the DAC cell (e.g., "cell-1") of the DAC 106_2. In this embodiment, the swapping circuit 904 decides to perform bit swapping and clock swapping in response to the notification signal generated due to detection of two bits having the same value "0". As shown in a bottom part of FIG. 10, the swapping circuit 904 generates the adjusted data sequences D'1_1 and D'K_1 (K=2) by swapping a portion 1002 of the data sequence D1_1 with a portion 1004 of the data sequence DK_1 (K=2), and generates the clocks RZ'_11 and RZ'_K1 (K=2) by swapping a portion 1006 of the reference clock RZ_11 with a portion of the reference clock RZ_K1 (K=2). The adjusted data sequence D'1_1 is sampled by rising edges of the clock RZ'_11, such that bits to be processed by one DAC cell (e.g., "cell-1") of the DAC 106_1 are "11110". The adjusted data sequence D'K_1 (K=2) is sampled by rising edges of the clock RZ'_K1 (K=2), such that bits to be processed by one DAC cell (e.g., "cell-1") of the DAC 106_K are "000010". It should be noted that the same bit sequence "10100101100" is converted by using DAC cell (e.g., "cell-1") of DAC 106_1 and DAC cell (e.g., "cell-1") of DAC 106_K.

The present invention has no limitations on the DAC cell design. Hence, clock swapping may be omitted, depending upon the actual DAC cell design. That is, a clock swapping function of the swapping circuit 904 may be optional. In practice, any time-interleaved DAC using the proposed TDEM technique for using DAC cells of a same DAC (i.e., DAC cells of a same DAC channel) to generate a voltage output representative of one thermometer code and using DAC cells of different DACs (i.e., DAC cells of different DAC channels) to generate a voltage output representative of another thermometer code falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A time-interleaved digital-to-analog converter (DAC) for converting a digital signal into an analog signal, comprising:
   a digital processing circuit, arranged to generate a plurality of data sequences according to the digital signal of the time-interleaved DAC, wherein said plurality of data sequences comprise a first data sequence and a second data sequence;
   a time-domain dynamic element matching (TDEM) circuit, arranged to swap a portion of the first data sequence with a portion of the second data sequence to generate a first adjusted data sequence and a second adjusted data sequence, wherein the first adjusted data sequence comprises first bits of the first data sequence and first bits of the second data sequence, and the second adjusted data sequence comprises second bits of the first data sequence and second bits of the second data sequence;
   a plurality of DACs, each having at least one DAC cell, wherein said plurality of DACs comprise a first DAC and a second DAC, the first DAC comprises a first DAC cell that operates in response to the first adjusted data sequence, and the second DAC comprises a second DAC cell that operates in response to the second adjusted data sequence; and
   a combining circuit, arranged to generate the analog signal by combining analog outputs of said plurality of DACs.

2. The time-interleaved DAC of claim 1, wherein the first bits of the second data sequence and the second bits of the first data sequence are selected randomly.

3. The time-interleaved DAC of claim 1, wherein the first DAC comprises a plurality of third DAC cells including the first DAC cell, said plurality of data sequences comprise a plurality of third data sequences including the first data sequence, said plurality of third DAC cells are arranged to operate in response to data sequences derived from said plurality of third data sequences, respectively, and the digital processing circuit comprises:
   a dynamic element matching (DEM) circuit, arranged to set said plurality of third data sequences according to a DEM algorithm that is performed based on said plurality of third DAC cells.

4. The time-interleaved DAC of claim 3, wherein the second DAC comprises a plurality of fourth DAC cells including the second DAC cell, said plurality of data sequences further comprise a plurality of fourth data sequences including the second data sequence, said plurality of fourth DAC cells are arranged to operate in response to data sequences derived from said plurality of fourth data sequences, respectively, and the DEM circuit is further arranged to set said plurality of fourth data sequences according to a DEM algorithm that is performed based on said plurality of fourth DAC cells.

5. The time-interleaved DAC of claim 1, wherein the TDEM circuit comprises:
   a detection circuit, arranged to check the first data sequence and the second data sequence to generate a notification signal; and
   a swapping circuit, arranged to swap said portion of the first data sequence with said portion of the second data sequence according to the notification signal.

6. The time-interleaved DAC of claim 5, wherein the detection circuit is arranged to detect if two bits to be successively processed have a same binary value, where said two bits include one bit belonging to the first data sequence and another bit belonging to the second data sequence, and is further arranged to generate the notification signal for informing the swapping circuit of detection of said two bits having the same binary value.

7. The time-interleaved DAC of claim 6, wherein in response to the notification signal, the swapping circuit randomly determines whether to swap said portion of the first data sequence with said portion of the second data sequence.

8. The time-interleaved DAC of claim 5, further comprising:
   a clock generating circuit, arranged to generate a plurality of reference clocks, wherein said plurality of reference clocks comprise a first reference clock and a second reference clock;
   wherein the first DAC cell is clocked by a first clock, the second DAC cell is clocked by a second clock, and the swapping circuit is further arranged to generate the first clock and the second clock by swapping a portion of the first reference clock with a portion of the second reference clock according to the notification signal.

9. The time-interleaved DAC of claim 8, wherein the detection circuit is arranged to detect if two bits to be successively processed have a same binary value, where said two bits include one bit belonging to the first data sequence and another bit belonging to the second data sequence, and is further arranged to generate the notification signal for informing the swapping circuit of detection of said two bits having the same binary value.

10. The time-interleaved DAC of claim 9, wherein in response to the notification signal, the swapping circuit randomly determines whether to swap said portion of the first data sequence with said portion of the second data sequence and swap said portion of the first reference clock with said portion of the second reference clock.

11. A time-interleaved digital-to-analog conversion method for converting a digital signal into an analog signal, comprising:
   generating a plurality of data sequences according to the digital signal, wherein said plurality of data sequences comprise a first data sequence and a second data sequence;
   performing a time-domain dynamic element matching (TDEM) operation to generate a first adjusted data sequence and a second adjusted data sequence by swapping a portion of the first data sequence with a portion of the second data sequence, wherein the first adjusted data sequence comprises first bits of the first data sequence and first bits of the second data sequence, and the second adjusted data sequence comprises second bits of the first data sequence and second bits of the second data sequence; and generating the analog signal by combining analog outputs of a plurality of digital-to-analog converters (DACs) each having at least one DAC cell, wherein said plurality of DACs comprise a first DAC and a second DAC, the first DAC comprises a first DAC cell that operates in response to the first adjusted data sequence, and the second DAC comprises a second DAC cell that operates in response to the second adjusted data sequence.

12. The time-interleaved digital-to-analog conversion method of claim 11, wherein performing the TDEM operation to generate the first adjusted data sequence and the second adjusted data sequence comprises:

selecting the first bits of the second data sequence and the second bits of the first data sequence randomly.

13. The time-interleaved digital-to-analog conversion method of claim 11, wherein the first DAC comprises a plurality of third DAC cells that comprise the first DAC cell, said plurality of data sequences comprise a plurality of third data sequences that comprise the first data sequence, said plurality of third DAC cells are arranged to operate in response to data sequences derived from said plurality of third data sequences, respectively, and generating said plurality of data sequences according to the digital signal comprises:

performing a dynamic element matching (DEM) operation to set said plurality of third data sequences according to a DEM algorithm that is based on said plurality of third DAC cells.

14. The time-interleaved digital-to-analog conversion method of claim 13, wherein the second DAC comprises a plurality of fourth DAC cells that comprise the second DAC cell, said plurality of data sequences further comprise a plurality of fourth data sequences that comprise the second data sequence, said plurality of fourth DAC cells are arranged to operate in response to data sequences derived from said plurality of fourth data sequences, respectively, and generating said plurality of data sequences according to the digital signal further comprises:

performing the DEM operation to set said plurality of fourth data sequences according to the DEM algorithm that is based on said plurality of fourth DAC cells.

15. The time-interleaved digital-to-analog conversion method of claim 11, wherein performing the TDEM operation to generate the first adjusted data sequence and the second adjusted data sequence comprises:

checking the first data sequence and the second data sequence to generate a notification signal; and swapping said portion of the first data sequence with said portion of the second data sequence according to the notification signal.

16. The time-interleaved digital-to-analog conversion method of claim 15, wherein checking the first data sequence and the second data sequence to generate the notification signal comprises:

detecting if two bits to be successively processed have a same binary value, where said two bits include one bit belonging to the first data sequence and another bit belonging to the second data sequence; and generating the notification signal for instructing swapping of said portion of the first data sequence and said portion of the second data sequence in response to detection of said two bits having the same binary value.

17. The time-interleaved digital-to-analog conversion method of claim 16, wherein swapping of said portion of the first data sequence and said portion of the second data sequence is controlled in a random manner.

18. The time-interleaved digital-to-analog conversion method of claim 15, further comprising:

generating a plurality of reference clocks, wherein said plurality of reference clocks comprise a first reference clock and a second reference clock; and generating a first clock and a second clock by swapping a portion of the first reference clock with a portion of the second reference clock according to the notification signal;

wherein the first DAC cell is clocked by the first clock, and the second DAC cell is clocked by the second clock.

19. The time-interleaved digital-to-analog conversion method of claim 18, wherein checking the first data sequence and the second data sequence to generate the notification signal comprises:

detecting if two bits to be successively processed have a same binary value, where said two bits include one bit belonging to the first data sequence and another bit belonging to the second data sequence; and generating the notification signal for instructing swapping of said portion of the first data sequence and said portion of the second data sequence and swapping of said portion of the first reference clock and said portion of the second reference clock in response to detection of said two bits having the same binary value.

20. The time-interleaved digital-to-analog conversion method of claim 19, wherein swapping of said portion of the first data sequence and said portion of the second data sequence and swapping of said portion of the first reference clock and said portion of the second reference clock are controlled in a random manner.

* * * * *